(12) United States Patent
Wen et al.

(10) Patent No.: US 11,218,155 B2
(45) Date of Patent: Jan. 4, 2022

(54) APPARATUS AND METHODS FOR DIGITAL FRACTIONAL PHASE LOCKED LOOP WITH A CURRENT MODE LOW PASS FILTER

(71) Applicant: Ciena Corporation, Hanover, MD (US)

(72) Inventors: Tingjun Wen, Ottawa (CA); Sadok Aouini, Gatineau (CA); Naim Ben-Hamida, Nepean (CA); Mahdi Parvizi, Kanata (CA); Matthew Mikkelsen, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/101,665

(22) Filed: Nov. 23, 2020

(65) Prior Publication Data

US 2021/0273644 A1 Sep. 2, 2021

Related U.S. Application Data

(63) Continuation of application No. 16/804,070, filed on Feb. 28, 2020, now Pat. No. 10,848,164.

(51) Int. Cl.

| | |
|---|---|
| *H03L 7/06* | (2006.01) |
| *H03L 7/197* | (2006.01) |
| *H03L 7/087* | (2006.01) |
| *H03L 7/107* | (2006.01) |
| *H03L 7/093* | (2006.01) |
| *H03L 7/099* | (2006.01) |

(52) U.S. Cl.
CPC ............ *H03L 7/1974* (2013.01); *H03L 7/087* (2013.01); *H03L 7/093* (2013.01); *H03L 7/0992* (2013.01); *H03L 7/107* (2013.01); *H03L 2207/50* (2013.01)

(58) Field of Classification Search
CPC ..... H03L 7/1974; H03L 7/107; H03L 7/0992; H03L 7/087; H03L 7/093; H03L 2207/50; H03L 7/1072; H03L 7/1075; H03L 7/1077
USPC ........................................................ 327/156
See application file for complete search history.

(56) References Cited

U.S. PATENT DOCUMENTS

| | | | |
|---|---|---|---|
| 6,693,494 B2 | 2/2004 | Fan | |
| 7,668,279 B1 | 2/2010 | You et al. | |
| 2008/0061889 A1 | 3/2008 | Matsumoto et al. | |
| 2017/0250692 A1* | 8/2017 | Motozawa | H03K 19/017509 |
| 2019/0219452 A1* | 7/2019 | Hayes | G01K 7/16 |

* cited by examiner

*Primary Examiner* — Metasebia T Retebo
(74) *Attorney, Agent, or Firm* — Young Basile Hanlon & MacFarlane, P.C.

(57) ABSTRACT

Described is a digital fractional phase locked loop (DFPLL) with a current mode low pass filter. The DFPLL includes a binary phase frequency detector (BPFD) configured to output a directional pulse based on comparison of a reference clock and a feedback clock, a current mode low pass filter connected to the BPFD, and a current controlled oscillator (CCO) connected to the current mode low pass filter. The current mode low pass filter configured to output a control current based on at least the directional pulse when a current steering switch directly controlled by the directional pulse switches to the CCO. The CCO configured to adjust a frequency of the CCO based on the control current to generate an output clock. The feedback clock based on the output clock and the reference clock aligned with the feedback clock by adjusting the frequency of the output clock until frequency and phase lock.

17 Claims, 4 Drawing Sheets

APPARATUS AND METHODS FOR DIGITAL FRACTIONAL PHASE LOCKED LOOP WITH A CURRENT MODE LOW PASS FILTER

CROSS REFERENCE TO RELATED APPLICATIONS

This application is a continuation of U.S. patent application Ser. No. 16/804,070, filed on Feb. 28, 2020, the entire content of which is incorporated by reference.

TECHNICAL FIELD

This disclosure relates to phase locked loops (PLLs). More specifically, this disclosure relates to a digital fractional PLL with a current mode low pass filter.

BACKGROUND

Phase locked loops (PLLs) are widely used in a variety of electronic applications and circuits including, but not limited to, telecommunications, computers, clock and data recovery circuits, frequency synthesizers, and analog-to-digital converts. PLLs may be implemented using analog components, digital components, and combinations thereof. Analog PLLs occupy large circuit areas, are susceptible to process, voltage and temperature variations, and have substantial power requirements as compared to digital PLLs. Digital PLLs, however, also suffer from certain disadvantages. For example, large loop gain factors are needed to guarantee loop stability and achieve high bandwidths in the digital PLL. Large loop gain factors, however, translate into high quantization noise and high jitter performance.

A technique for improving the performance of the digital PLLs is to use time to digital converters (TDC) as the phase detector. There are multiple drawbacks with using TDCs in digital PLLs. TDCs are very expensive in terms of power and area and performance of the PLL is limited by the resolution of the TDC. In addition, implementing the TDC in the digital PLL is complex. To achieve performance similar to analog PLLs, tens of femtoseconds of accuracy is required, which is very hard to achieve in advanced complementary metal-oxide-semiconductor (CMOS) technologies.

The conventional digital PLLs include low pass filters which use complex voltage domain adders, multipliers, and data to analog converters (DACs). These components are very expensive in terms of power and area. Moreover, the multipliers and DACs are high speed designs which are challenging to implement effectively and efficiently. In addition, the control signal produced from the low pass filter by these designs is in the voltage domain so either a varactor based narrow band LC oscillator is used or a coarse resolution digital voltage-controlled oscillator is used. These types of oscillators provide limited bandwidth controllability or have limited frequency resolution. In addition, non-linearity is high in digital voltage-controlled oscillators.

Fractional mode PLLs allow for the use of parameters with a wider range to fine control the filter bandwidth to minimize the quantization noise and optimize the overall output jitter. Known solutions result in unsatisfactory jitter, power, and area budget.

SUMMARY

Described herein are apparatus and methods for a digital fractional phase locked loop (DFPLL) with a current mode low pass filter. The DFPLL includes a binary phase frequency detector (BPFD) configured to output a directional pulse based on comparison of a reference clock and a feedback clock, a current mode low pass filter connected to the BPFD, and a current controlled oscillator (CCO) connected to the current mode low pass filter. The current mode low pass filter configured to output a control current based on at least the directional pulse when a current steering switch directly controlled by the directional pulse switches to the CCO and the CCO configured to adjust a frequency of the CCO based on the control current to generate an output clock. The feedback clock being based on the output clock and the reference clock being aligned with the feedback clock by adjusting the frequency of the output clock until frequency and phase lock.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
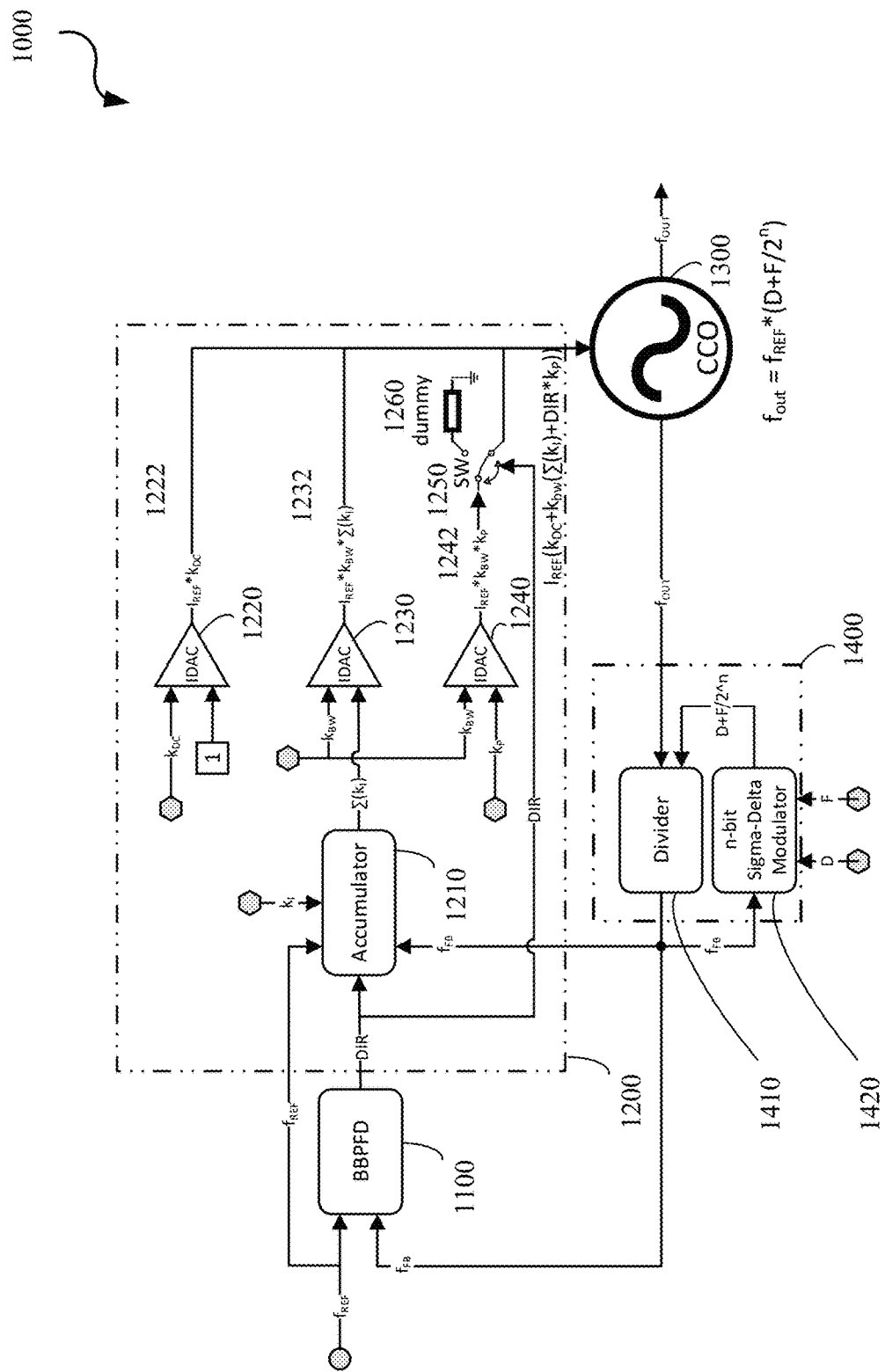
FIG. 1 is a block diagram of an example of a fractional digital phase locked loop with a current mode low pass filter in accordance with embodiments of this disclosure.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or" That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Described herein are apparatus, device, and methods for a digital fractional phase locked loop (DFPLL) with a current mode low pass filter. In an implementation, the DFPLL uses a binary phase and frequency detector (BPFD) or bang-bang PFD (BBPFD) as a phase detector which does not require a complex time to digital converter. This permits the use of a simple and more efficient accumulator in the current mode low pass filter of the DFPLL. For example, the time to digital converter usually produces multiple digital bits while a BPFD or a BBPFD produces only 0 or 1 to indicate whether the feedback clock leads or lags the reference clock. A single bit output from a BPFD or a BBPFD is enough to minimize the output jitter within the physical and electrical limitations of a particular fabrication technology, such as 7 nm or 5 nm FINFET, when the aforementioned DFPLL is in the locked state. The complexity of the low pass filter implementation will be greatly reduced, and the power consumption of the low power filter implementation will also be greatly reduced due to this single bit input.

The current mode low pass filter eliminates the need for complex, high speed voltage domain adders and multipliers which are expensive in terms of power and area and are a challenge to implement effectively and efficiently. In an implementation, the current mode low pass filter uses current mode DACs and current mirrors to perform addition and multiplication naturally in the analog domain. Excellent linearity properties are observed without the need of additional circuitry. Use of low speed DACs in the DFPLL results in low power and small area requirements. In addition, the current mode low pass filter serves as a power regulator to filter out on-board switching power noise. This is possible because the current mode low pass filter tracks a reference current which is stable with respect to temperature and process variations. As such, a regulator or additional circuitry is not needed to filter the on-board switching power noise.

In an implementation, the DFPLL uses a current controlled oscillator (CCO) which has a wide tuning range to accommodate wide temperate ranges and process variations, resulting in improved device yields. In addition, the current controlled oscillator has finer resolution and better linearity which leads to obtaining the low jitter needed to meet the stringent optical communication requirements. The current controlled oscillator removes the fold-in spurs in the close-in phase noise that results from the non-linearity seen with respect to voltage-controlled oscillators.

In an implementation, a proportional path is implemented by connecting an output of the BBPFD directly to a current controlled oscillator. This results in minimal loop delay and stabilizes the loop dynamics. A current steering switch is used in the proportional path so that low speed digital-to-analog converters (DACs) can be used in the current mode low pass filter. The use of low speed DACs results in much higher linearity, smaller area, lower power use, and reduced design complexity.

In an implementation, the DFPLL uses separate paths for the proportional path and an integral path. Consequently, high speed DACs are not needed in the integral path. In addition, the DFPLL includes a static direct current (DC) for coarse frequency band tuning at start-up. This static DC path accounts for temperature and processing variations during component manufacture and assembly. The static DC path is a separate path from the proportional path and the integral path. As a result, high speed DACs are not needed in the static DC path.

FIG. 1 is a block diagram of an example of a DFPLL 1000 which intakes a reference clock ($f_{REF}$) and generates an output clock (four):

$$f_{OUT} = f_{REF} * \left(D + \frac{F}{2^n}\right) \quad \text{Equation 1}$$

where D is an integer divider, F is a fractional numerator, $2^n$ is a fractional denominator, and n is the internal bit width of sigma-delta modulator 1420.

The DFPLL 1000 includes a binary phase frequency detector (BPFD) or bang-bang PFD (BBPFD) 1100 which has an input connected to the reference clock $f_{REF}$, another input connected to the feedback clock $f_{FB}$, and an output connected to a digitally controlled current mode low pass filter 1200. The current mode low pass filter 1200 includes an accumulator 1210 and a plurality of current mode digital to analog converters (IDACs) 1220, 1230, and 1240, where the IDAC 1220 is for a DC path 1222 with a gain $k_{DC}$, the IDAC 1230 is for an integral path 1232 with a gain $k_I$, and the IDAC 1240 is for a proportional path 1242 with a gain $k_P$. In an implementation, the accumulator 1210 is a digital accumulator. In an implementation, the IDACs 1220, 1230, and 1240 may be implemented with current mirrors. Since IDACs are used in the current mode low pass filter 1200, the only voltage domain low pass filter component is a simple accumulator which can be operated at high speed without violating the timing constraints set for high speed clock generation.

The output of the current mode low pass filter 1200 is connected to a current controlled oscillator (CCO) 1300. An output of the CCO 1300 is the output of the DFPLL 1000 and is also coupled back to the BBPFD 1100 as a feedback clock ($f_{FB}$) via a fractional divider circuit 1400. The fractional divider circuit 1400 includes a divider 1410 and a sigma-delta modulator 1420 with inputs D and F. Those of ordinary skill may recognize that other elements may be desirable or necessary to implement the DFPLL described herein. However, because such elements are well known in the art, and because they do not facilitate a better understanding of the disclosed embodiments, a discussion of such elements may not be provided herein.

Operationally, the BBPFD 1100 compares the edges of the incoming reference clock $f_{REF}$ and the feedback clock $f_{FB}$ generated by the fractional divider circuit 1400 and produces a binary phase difference signal or directional signal (DIR) which indicates whether the feedback clock $f_{FB}$ is leading or lagging with respect to the reference clock $f_{REF}$. In an implementation, the DIR signal is a "0" (low) or a "1" (high) signal, which simplifies the overall architecture. In an implementation, if the BBPFD 1100 transfer function covers 360° or more in phase, the DFPLL 1000 will lock the rising edge of the reference clock to the rising edge of the feedback clock. In an implementation, if the BBPFD 1100 transfer function covers 360° or more in phase, the DFPLL 1000 will lock the falling edge of the reference clock to the falling edge of the feedback clock. In an implementation, if the BBPFD 1100 transfer function covers 180°, the DFPLL 1000 can be configured to lock the rising edge of the reference to either the rising edge or the falling edge of the feedback clock. The DIR signal is then fed to the current mode low pass filter 1200 to filter out the quantization noise generated by the sigma-delta modulator 1420 and the high frequency noise generated by other components in the DFPLL 1000.

As noted, the current mode low pass filter 1200 includes the DC path 1222, the integral path 1232, and the proportional path 1242.

In the integral path 1232, the accumulator 1210 intakes the gain $k_I$, the DIR signal, the feedback clock $f_{FB}$, and the reference clock $f_{REF}$ and outputs the summation as an input to the IDAC 1230. The output current $I_{IP}$ of the integral path 1232 is then:

$$I_{IP} = I_{REF} * k_{BW} * \Sigma(k_I) \quad \text{Equation 2}$$

where $I_{REF}$ is the reference current, $k_{BW}$ is the bandwidth control coefficient and controls the bandwidth of the DFPLL 1000, and $k_I$ is the integral path gain.

In the proportional path 1242, the DIR signal is directly connected to a current steering switch (SW) 1250 which switches between a dummy load 1260 and the CCO 1300. If the dummy load were not there, the static and constant current generated by IDAC 1230 will have no sinking path to ground when the switch 1250 is turned off from IDAC 1230 by the signal DIR. Because the DIR signal is a relatively high speed signal, this creates significant glitches to the CCO and renders the proportional path not functional. This dummy load enables the high speed and the only high speed operation of the proportional path within the current mode low pass filter 1200. The DC path 1220 and the integral path 1230 do not need high speed operation. When connected to the CCO 1300, the DIR signal is directly applied to the output of the IDAC 1240 to minimize the delay in the DFPLL 1000 loop. This minimizes the number of poles in the DFPLL 1000 loop thus stabilizing the DFPLL 1000 loop and maximizes the operational bandwidth of the DFPLL 1000. The output current $I_{PP}$ of the proportional path 1242 is then:

$$I_{PP} = I_{REF} * k_{BW} * k_P \quad \text{Equation 3}$$

where $I_{REF}$ is the reference current, $k_{BW}$ is the bandwidth control coefficient and controls the bandwidth of the DFPLL 1000, and $k_P$ is the proportional path gain.

In the DC path 1222, the IDAC 1220 inputs the gain $k_{DC}$ and unity. The DC path 1222 centers the frequency or performs a DC offset. The output current $I_{DC}$ of the DC path 1222 is then:

$$I_{DC} = I_{REF} * k_{DC} \quad \text{Equation 4}$$

where $I_{REF}$ is the reference current and $k_{DC}$ is the DC path gain.

The output of the current mode low pass filter 1200 is the control current ($I_{CTRL}$) which controls the CCO 1300 and is:

$$I_{CTRL} = I_{REF}(k_{DC} * k_{BW}(\Sigma(k_I) + DIR * k_P))$$ Equation 5

The output clock $f_{OUT}$ from the CCO 1300 is proportional to the output current $I_{CTRL}$. The output clock $f_{OUT}$ of the CCO 1300 is acted upon by the fractional divider circuit 1400. In particular, the output clock $f_{OUT}$ is divided down by the divider 1410, which has an input divide ratio of $D+F/2^n$ modulated by the sigma-delta modulator 1420, where D is the integer divide ratio, F is the fractional numerator, $2^n$ is the fractional denominator, and n is the internal bit width of sigma-delta modulator 1420. The output clock $f_{FB}$ of the divider 1410 carries the quantization noise shaped by the sigma-delta modulator 1420, which in turn is filtered by the current mode low pass filter 1200. The DFPLL 1000 will be unable to phase lock to the reference clock $f_{REF}$ if the quantization noise is not properly filtered out.

Figure 2:
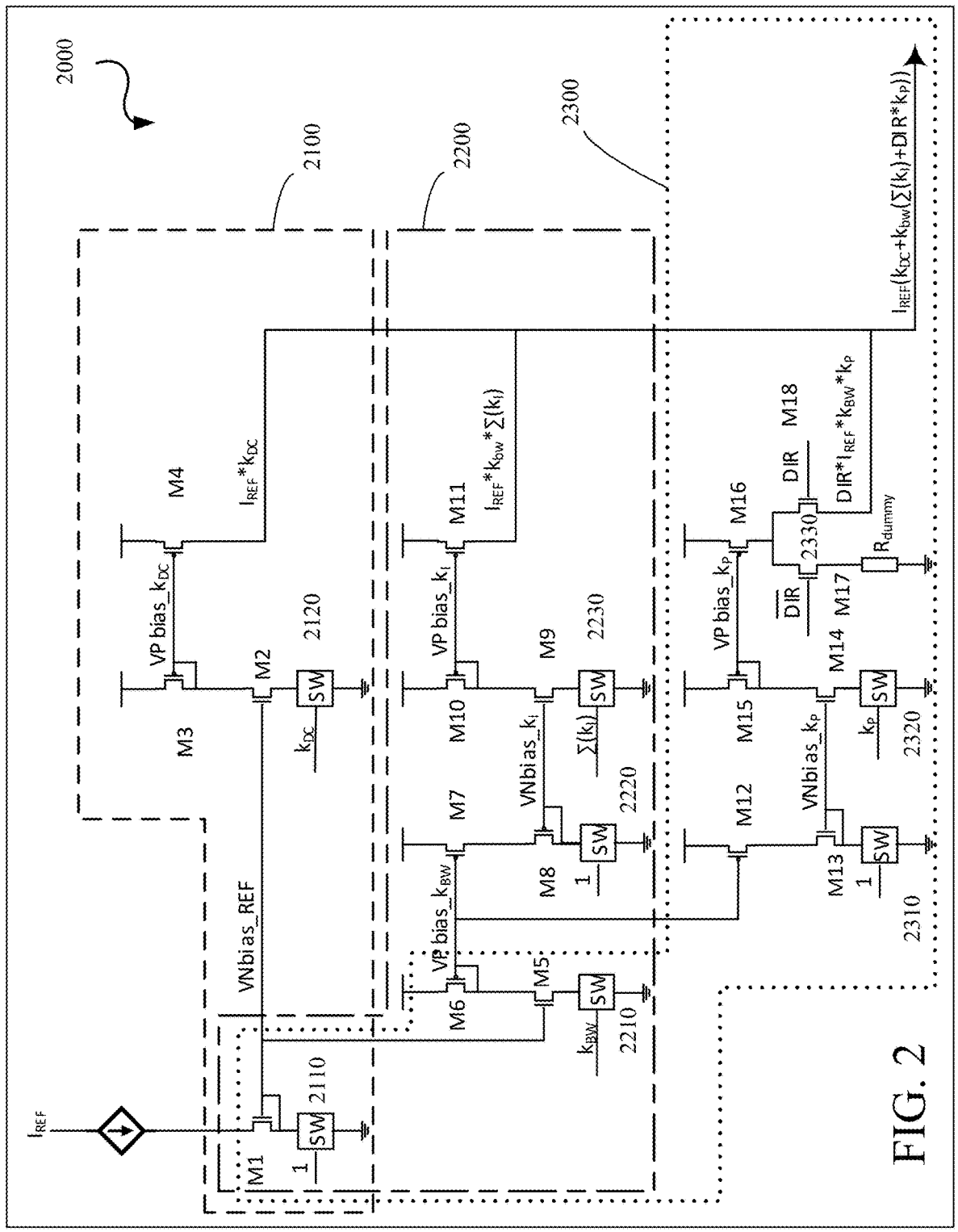
FIG. 2 is a block diagram of a current mode low pass filter for a fractional digital phase locked loop in accordance with embodiments of this disclosure.

FIG. 2 is a block diagram of a current mode low pass filter 2000 for a fractional digital phase locked loop in accordance with embodiments of this disclosure. The input to the current mode low pass filter 2000 is a reference current ($I_{REF}$) and the output is the control current ($I_{CTRL}$) as shown in Equation 5. The current mode low pass filter 2000 includes a DC path 2100, an integral path 2200, and a proportional path 2300. Each of the DC path 2100, the integral path 2200, and the proportional path 2300 consist of a plurality of transistors configured in a current mirror architecture and switchable arrays, where each switchable array is configured to add or remove a unit current path to adjust a current mirror ratio. This later functionality provides the multiplication and addition functionality otherwise needed from power and area expensive voltage domain multipliers and adders.

The DC path 2100 includes transistors M1, M2, M3, and M4 connected in a cascaded current mirror configuration, where the transistor M1 is connected to the reference current $I_{REF}$ and to a SW 2110, the M2 transistor is connected to a SW 2120, and the transistor M4 is tied to an output of the current mode low pass filter 2000. The SW 2110 is tied to a unity input and the SW 2120 is tied to a gain $k_{DC}$ input. In an implementation, the transistors M1 and M2 are n-channel MOSFETs and the transistors M3 and M4 are p-channel MOSFETs. The output current $I_{REF} * k_{DC}$ of the DC path 2100 is used at start-up to compensate the process and temperature variations and to center the CCO output frequency.

The integral path 2200 includes transistors M1, M5, M6, M7, M8, M9, M10, and M11 connected in a cascaded current mirror configuration, where the transistor M1 is connected to the reference current $I_{REF}$ and to a SW 2110, the M5 transistor is connected to a SW 2210, the M8 transistor is connected to a SW 2220, the M9 transistor is connected to a SW 2230, and the transistor M11 is tied to an output of the current mode low pass filter 2000. The SW 2110 is tied to a unity input, the SW 2210 is tied to a $k_{BW}$ input, the SW 2220 is tied to a unity input, and the SW 2230 is tied to a $\Sigma k_I$ input. In an implementation, the transistors M1, M5, M8, and M9 are n-channel MOSFETs and the transistors M6, M7, M10, and M11 are p-channel MOSFETs.

The proportional path 2300 includes transistors M1, M5, M6, M12, M13, M14, M15, and M16 connected in a cascaded current mirror configuration, where the transistor M1 is connected to the reference current $I_{REF}$ and to a SW 2110, the M5 transistor is connected to a SW 2210, the M13 transistor is connected to a SW 2310, the M14 transistor is connected to a SW 2320, and the transistor M16 is tied to a current steering switch 2330 as discussed below. The SW 2110 is tied to a unity input, the SW 2210 is tied to a $k_{BW}$ input, the SW 2310 is tied to a unity input, and the SW 2320 is tied to a $k_P$ input. In an implementation, the transistors M1, M5, M13, and M14 are n-channel MOSFETs and the transistors M6, M12, M15, and M16 are p-channel MOSFETs.

A stability issue with digital PLLs operating in the voltage domain is the delay introduced by the filter path as it introduces more poles in the digital PLLs. Inclusion of the current steering switch 2330 removes the delay in the filter path by directly connecting the DIR signal from the BBPFD to the current steering switch 2330. In an implementation, the current steering switch 2330 includes a transistor M17 tied to a dummy load $R_{dummy}$ and a complement of the DIR signal and a transistor M18 tied to an output of the current mode low pass filter 2000 and the DIR signal. The constant current $I_{REF} * k_{BW} * k_P$ is switched between the dummy load $R_{dummy}$ and the CCO. When the transistor M17 is connected to the CCO, the output of the current mode low pass filter 2000 is as shown at Equation 5. The Kp coefficient is determined by SW 2320 and will not be toggling during normal operation. This is the key difference between this current mode low pass filter implementation and other conventional implementation. It only requires switch 2330 to be in high speed operation. This configuration permits the use of very slow but high quality IDACs and current mirrors in the $k_{DC}$ path 2100, $k_I$ path 2200, and $k_P$ path 2300, which results in a stable, low power, small area, and low jitter design.

Figure 3:
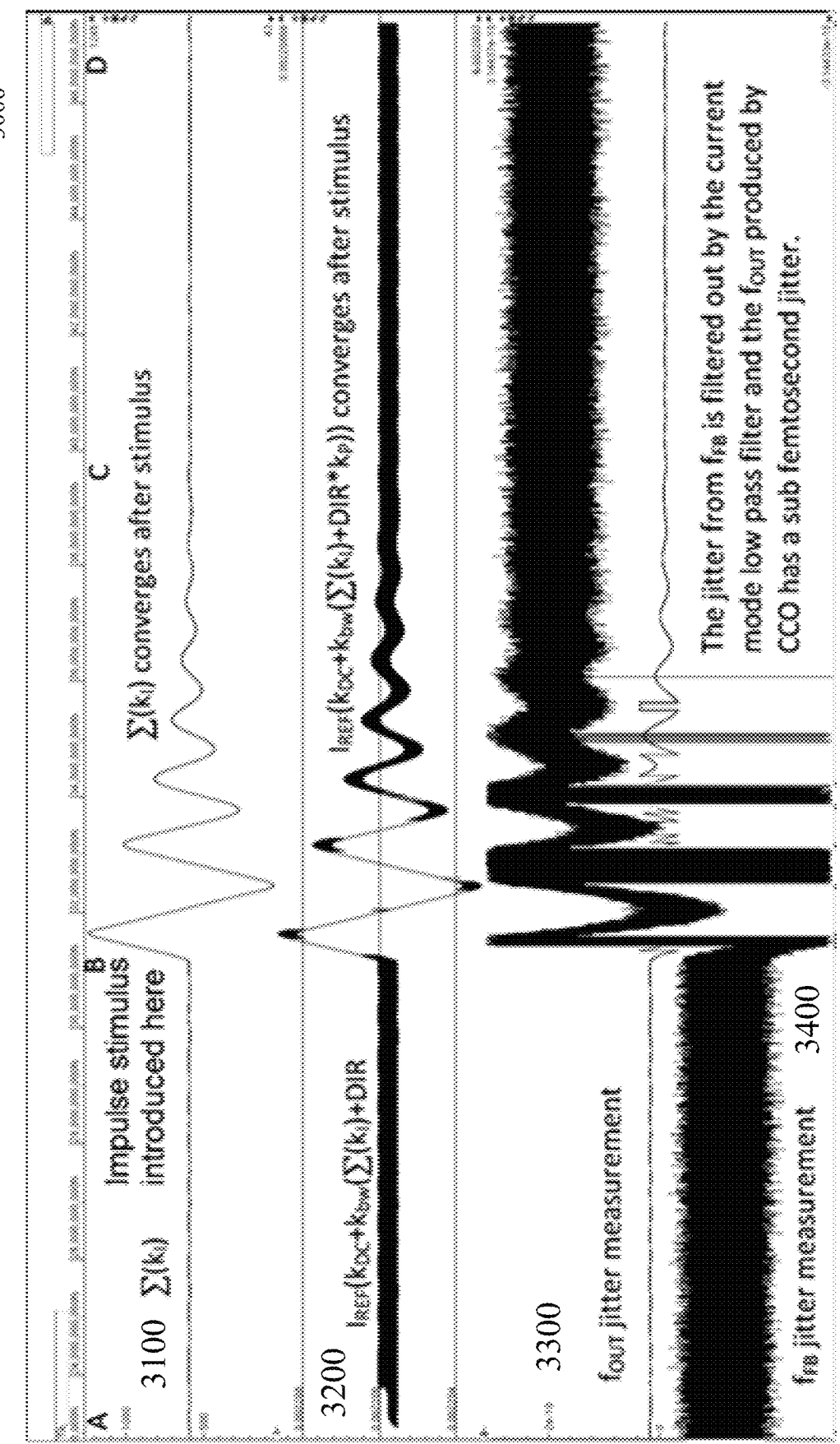
FIG. 3 is a graph showing loop stability of a fractional digital phase locked loop with a current mode low pass filter in accordance with embodiments of this disclosure.

FIG. 3 is a graph 3000 showing loop stability of a fractional digital phase locked loop with a current mode low pass filter in accordance with embodiments of this disclosure. The graph 3000 shows loop stability by injecting an impulse stimulus after the DFPLL has achieved the frequency and phase lock and then determining whether the DFPLL can reacquire the phase lock. In FIG. 3, the waveform 3100 is the accumulator output $\Sigma(k_I)$ as shown in FIG. 1 and FIG. 2. The waveform 3200 is the current mode low pass filter output control current $I_{REF}(k_{DC} + k_{bw}(\Sigma(k_I) + DIR * k_P))$ as shown in in FIG. 1 and FIG. 2. The waveform 3300 is the measured jitter from the CCO output $f_{OUT}$ as shown in FIG. 1 and FIG. 2. A waveform 3400 is the measured jitter from the feedback clock $f_{FB}$ as shown in FIG. 1 and FIG. 2.

From the time point A to time point B, the DFPLL loop has been frequency and phase locked to the reference clock since all 4 waveforms 3100, 3200, 3300, and 3400 are flat and there is no cycle slip with respect to $f_{OUT}$ jitter and $f_{FB}$ jitter. At time point B, a strong external impulse stimulus was introduced in the simulation to disturb the CCO output such that it loses the lock as a response to the strong external stimulus. As can be seen, the DFPLL re-acquires the lock from time point B to time point C. During time point B to time point C, the accumulator output $\Sigma(k_I)$ converges to a small jump, the current mode low pass filter output control current $I_{REF}(k_{DC} + k_{bw}(\Sigma(k_I) + DIR * k_P))$ converges to a small jump with a thick proportional $DIR * k_P$ envelope which makes the loop stable. Both $f_{OUT}$ jitter and $f_{FB}$ jitter cycle slip and gradually converge to a steady lock state and continuously remain locked beyond time point D. This means that the loop is unconditionally stable and can correctly achieve frequency and phase lock with a state of the art jitter performance.

Figure 4:
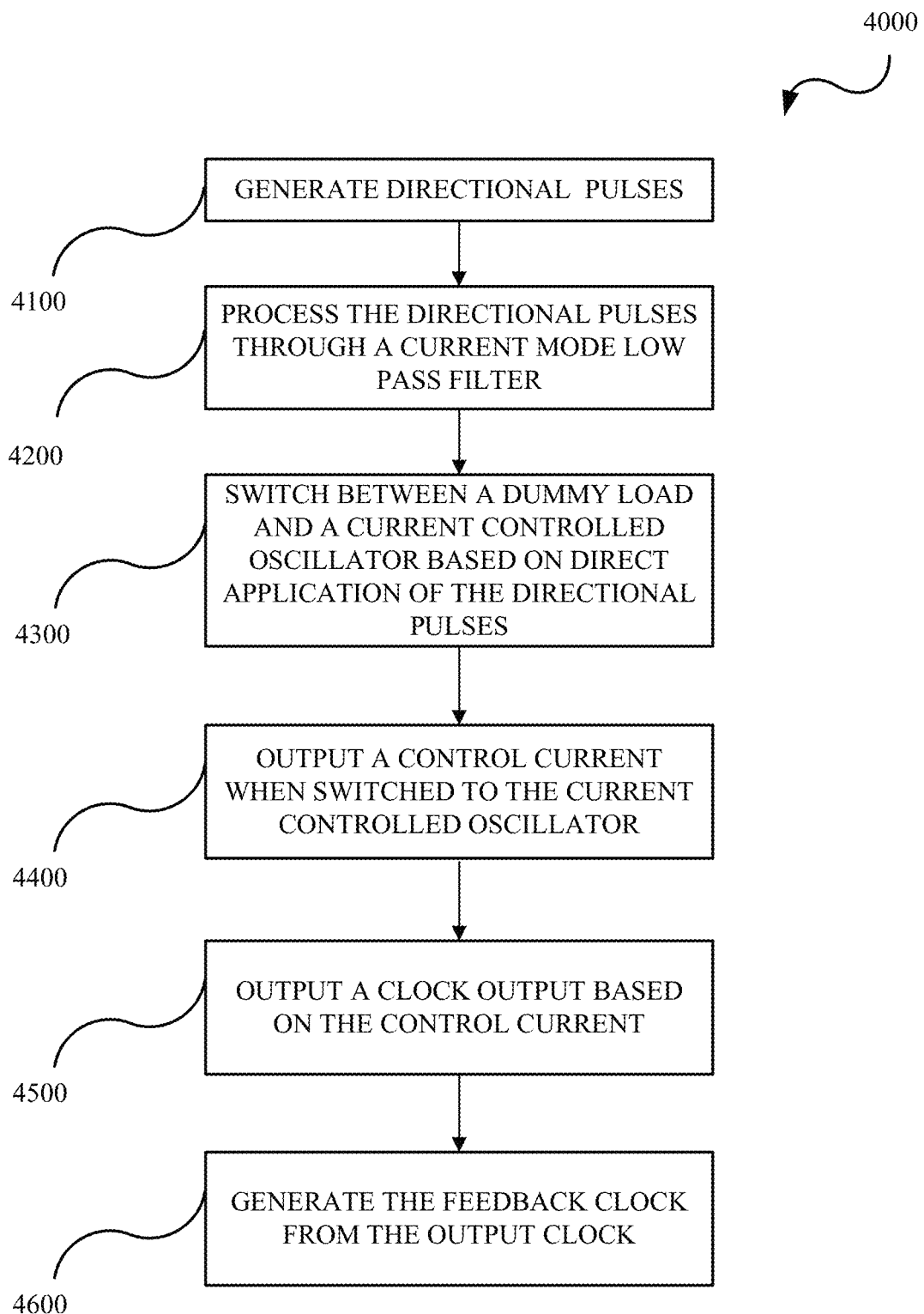
FIG. 4 is a flowchart of an example technique for a fractional digital phase locked loop with a current mode low pass filter in accordance with embodiments of this disclosure.

FIG. 4 is a flowchart of an example method 4000 for a digital fractional phase locked loop (DFPLL) with a current mode low pass filter in accordance with embodiments of this disclosure. The method 4000 includes: generating 4100 directional pulses from detected phase and frequency differences between a reference clock and a feedback clock; processing 4200 the directional pulses through a current mode low pass filter; switching 4300 between a dummy load and a current controlled oscillator based on direct application of the directional pulses; outputting 4400 a control current when switched to the current controlled oscillator; outputting 4500 a clock output based on the control current; and generating 4600 the feedback clock from the output clock. The method 4000 may be implemented, as appropriate and applicable, by the DFPLL 1000 of FIG. 1 and the current mode low pass filter of FIG. 2.

The method 4000 includes generating 4100 directional pulses from detected phase and frequency differences between a reference clock and a feedback clock. In an implementation, a BBPFD detects phase and frequency differences between a reference clock and a feedback clock and generates directional or difference pulses. In an implementation, the BBPFD compares the edges of the reference clock and the feedback clock. In an implementation, the DIR signal is a "0" (low) or a "1" (high) signal. In an implementation, if the BBPFD transfer function covers 360° or more in phase, the DFPLL will lock the rising (falling) edge of the reference clock to the rising (falling) edge of the feedback clock. In an implementation, if the BBPFD transfer function covers 180°, the DFPLL can be configured to lock the rising edge of the reference to either the rising edge or the falling edge of the feedback clock. Upon DFPLL locking, the directional pulse is minimal and jitter is minimized.

The method 4000 includes processing 4200 the directional pulses through a current mode low pass filter. The current mode low pass filter filters out quantization noise generated by a sigma-delta modulator and high frequency noise generated by other components in the DFPLL. The current mode low pass filter also filters out on-board switching power noise, therefore acting as a regulator. The current mode low pass filter has three processing paths including a DC path, an integral path, and a proportional path. The DC path centers the frequency range of the DFPLL and the integral and proportional paths help fine adjust to the frequency of operation. Each of the processing paths are implemented using current mode DACS (IDACS). In an implementation, the IDACS are implemented using current mirror configurations and switchable arrays. In an implementation, the current mirror configurations are cascaded current mirror configurations.

The method 4000 includes switching 4300 between a dummy load and a current controlled oscillator based on direct application of the directional pulses. The proportional path includes a current steering switch which is directly controlled by the directional pulses. In an implementation, the current steering switch is connected to a dummy load and the CCO.

The method 4000 includes outputting 4400 a control current when switched to the current controlled oscillator. The current mode low pass filter outputs a control current when the current steering switch is switched to the CCO based on the directional pulses.

The method 4000 includes outputting 4500 a clock output based on the control current. The CCO adjusts the frequency based on the control current and generates a clock output, which is the output of the DFPLL.

The method 4000 includes generating 4600 the feedback clock from the output clock. The output clock is also fed to a fractional divider circuit to generate the feedback clock. The fractional divider circuit includes a divider and a sigma-delta modulator.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A digital fractional phase locked loop comprising:
   a current mode low pass filter including a DC path, a proportional path and an integral path, each of the proportional path and the integral path including a plurality of transistors configured in a current mirror arrangement and a plurality of switchable arrays tied to certain of the plurality of transistors to functionally implement multipliers and adders, the current mode low pass filter configured to
   receive a directional signal based on a comparison of a reference clock and a feedback clock; and
   output a control signal based on at least the directional signal when a current steering switch directly controlled by the directional pulse switches to a controlled oscillator; and
   the controlled oscillator configured to generate an output clock by adjusting a frequency of the controlled oscillator based on the control signal, the feedback clock being based on the output clock,
   wherein the reference clock being aligned with the feedback clock by adjusting the frequency of the output clock until frequency and phase lock.

2. The digital fractional phase locked loop of claim 1, wherein the current steering switch is implemented in the proportional path.

3. The digital fractional phase locked loop of claim 1, wherein the current steering switch switches between a dummy load and the controlled oscillator.

4. The digital fractional phase locked loop of claim 1, wherein the DC path is configured to center a frequency range for the digital fractional phase locked loop.

5. The digital fractional phase locked loop of claim 1, wherein an output of the proportional path is connected to the current steering switch.

6. The digital fractional phase locked loop of claim 1, further comprising
   a divider connected to the controlled oscillator; and
   a sigma-delta modulator connected to the divider,
   wherein the divider and sigma-delta modulator collectively generate the feedback clock.

7. The digital fractional phase locked loop of claim 1, wherein each switchable array is configured to add or remove a unit current path to adjust a current mirror ratio.

8. The digital fractional phase locked loop of claim 1, wherein the current mirror arrangement for the integral path and the current mirror arrangement for the proportional path are cascaded current mirror arrangements.

9. A digital filter comprising:
   a DC circuit configured to center a frequency range;
   an integral circuit;
   a proportional circuit, each of the proportional circuit and the integral circuit comprises
      a plurality of transistors configured in a current mirror arrangement; and
      a plurality of switchable arrays tied to certain of the plurality of transistors to functionally implement multipliers and adders; and
   a current steering switch connected to the proportional circuit, the current steering switch switching between a dummy load and a load,
   wherein a control signal is output based on a state of the current steering switch.

10. The digital filter of claim 9, wherein each switchable array is configured to add or remove a unit current path to adjust a current mirror ratio.

11. The digital filter of claim 9, wherein the DC path includes a plurality of transistors configured in a current mirror arrangement and a plurality of switchable arrays tied to certain of the plurality of transistors to functionally implement multipliers and adders.

12. The digital filter of claim 9, wherein the current mirror arrangement for the integral circuit and the current mirror arrangement for the proportional circuit are cascaded current mirror arrangements.

13. The digital filter of claim 9, wherein the control signal is output when the current steering switch is connected to the load.

14. A method, the method comprising:
- connecting a plurality of transistors in a current mirror arrangement and connecting a plurality of switchable arrays to certain of the plurality of transistors to functionally implement multipliers and adders in a DC path;
- connecting a plurality of transistors in a current mirror arrangement and connecting a plurality of switchable arrays to certain of the plurality of transistors to functionally implement multipliers and adders in an integral path; and
- connecting a plurality of transistors in a current mirror arrangement and connecting a plurality of switchable arrays to certain of the plurality of transistors to functionally implement multipliers and adders in a proportional path,
- wherein a control signal is output based on a state of a current steering switch.

15. The method of claim 14, further comprising connecting the current steering switch to the proportional path, the current steering switch configured to switch states between a dummy load and a load.

16. The method of claim 14, wherein each switchable array is configured to add or remove a unit current path to adjust a current mirror ratio.

17. The method of claim 14, wherein the current mirror arrangement for the integral path and the current mirror arrangement for the proportional path are cascaded current mirror arrangements.

* * * * *